United States Patent
Liu

(10) Patent No.: US 8,456,135 B2
(45) Date of Patent: Jun. 4, 2013

(54) HIGH VOLTAGE OUTPUT MONITORING DEVICE AND SYSTEM FOR A POWER BATTERY

(75) Inventor: Bing Liu, Wuhu (CN)

(73) Assignee: Chery Automobile Co., Ltd., Wuhu (CN)

( * ) Notice: Subject to any disclaimer, the term of this patent is extended or adjusted under 35 U.S.C. 154(b) by 260 days.

(21) Appl. No.: 13/002,978

(22) PCT Filed: Jul. 7, 2009

(86) PCT No.: PCT/CN2009/072662
§ 371 (c)(1),
(2), (4) Date: Jan. 6, 2011

(87) PCT Pub. No.: WO2010/003366
PCT Pub. Date: Jan. 14, 2010

(65) Prior Publication Data
US 2011/0115438 A1    May 19, 2011

(30) Foreign Application Priority Data
Jul. 8, 2008 (CN) .......................... 2008 1 0133073

(51) Int. Cl.
*H02J 7/00* (2006.01)
*H02H 3/247* (2006.01)
*B60K 1/00* (2006.01)

(52) U.S. Cl.
USPC ........... 320/135; 320/107; 320/115; 320/134; 320/136; 361/92; 180/65.1; 180/65.21

(58) Field of Classification Search
USPC ........................................ 320/135
See application file for complete search history.

(56) References Cited

U.S. PATENT DOCUMENTS 3,805,142 A * 4/1974 Rando .............................. 363/53
5,373,197 A * 12/1994 Ptacek et al. .................... 307/52

(Continued)

FOREIGN PATENT DOCUMENTS

| CN | 101194406 | 6/2008 |
| CN | 101330225 | 12/2008 |
| JP | 2008-133742 | 6/2008 |

OTHER PUBLICATIONS

International Search Report corresponding to co-pending International Patent Application Serial No. PCT/CN2009/072662, European Patent Office; dated Sep. 15, 2009; 6 pages.

*Primary Examiner* — Yalkew Fantu
(74) *Attorney, Agent, or Firm* — Nixon Peabody LLP

(57) ABSTRACT

A high voltage output monitoring device and system of a power battery comprises a monitoring module, a control module and a central processor module, wherein the monitoring module carries out high voltage output monitoring, pre-charge monitoring and relay switching times monitoring; the control module controls a relay switch; the central processor module carries out processing and analysis of monitor signals, packs relay state signals, sends the packed relay state signals to a battery management system (8), prognosticates a relay health condition, sends alarming signals to the battery management system (8), judges the pre-charge state, controls a high voltage system to be opened or closed, receives the control of the battery management system, and forces the high voltage system to be opened or closed. By using the monitoring device of the present invention, it is feasible to prognosticate the lift of high voltage relay, send the relay health alarm signal in real time and to avoid the relay from causing hazard when it is damaged and cannot be closed; Furthermore, it is favorable for extending the life of battery by monitoring and controlling the pre-charge state of power battery.

7 Claims, 4 Drawing Sheets

U.S. PATENT DOCUMENTS

| | | | |
|---|---|---|---|
| 5,602,462 A * | 2/1997 | Stich et al. | 323/258 |
| 5,737,168 A * | 4/1998 | Baker | 361/90 |
| 5,914,539 A * | 6/1999 | Borgmann et al. | 307/38 |
| 2003/0044689 A1 * | 3/2003 | Miyazaki et al. | 429/320 |
| 2007/0139005 A1 * | 6/2007 | Osawa | 320/115 |
| 2008/0157718 A1 * | 7/2008 | Ohnuki | 320/134 |

* cited by examiner

HIGH VOLTAGE OUTPUT MONITORING DEVICE AND SYSTEM FOR A POWER BATTERY

CROSS REFERENCE TO RELATED APPLICATIONS

This application is a U.S. national stage application claiming priority from International Application No. PCT/CN2009/072662, filed Jul. 7, 2009, and Chinese patent application No. 200810142704.7, filed on Jul. 29, 2008, each of which is incorporated herein in its entirety.

FIELD OF THE INVENTION

The present invention relates to a high voltage output monitoring device for a large-scale battery system with series/parallel connection, in particular to a high voltage output monitoring device and system of a power battery for hybrid power vehicle.

DESCRIPTION OF THE PRIOR ART

The high voltage output monitoring of a power battery has fundamental significance for a hybrid power vehicle, and it constitutes an indispensable element of the vehicle safety control and management system. However, many power battery systems from both abroad and home are not configured with such an important element, or only a pre-charge control part is configured therewith. It is highly hazardous when a high voltage that should be output under the control of a battery management system is not output, a high voltage that should be cut off under the control of the battery management system is not cut off. In this context, by prognosticating the life of a high voltage relay and issuing the health alarming signal of the high voltage relay in real-time, the hazard caused by the relay's undue failure to be closed when being damaged can be avoided; and monitoring and controlling the pre-charge states of a power battery is favorable for improving the life of the power battery. Therefore, a high voltage output monitoring device of a power battery is requisite for hybrid power vehicle.

SUMMARY OF THE INVENTION

It is the technical object of the present invention to provide a high voltage output monitoring device and system of a power battery that is used to prognosticate the life of a high voltage relay so as to avoid the hazard caused by the relay's failure to be closed when being damaged and to extend the life of the power battery.

To realize the aforementioned technical object, the present invention provides a specific technical solution as follows:

The present invention provides a high voltage output monitoring device comprising a monitoring module, a control module and a central processor module, wherein the monitoring module monitors the high voltage output, the pre-charge and the switching times of a relay; the control module controls the switching of the relay; the central processor module processes and analyzes the monitoring signals, packs the relay state signals and sends the packaged relay state signals to a battery management system BMS, prognosticates the relay health condition and sends alarming signals to BMS, judges the pre-charge states, controls the switching ON or OFF of a high voltage system, receives the control of the BMS and switches on or off the high voltage system arbitrarily.

Based on the acquired relay state signals, the high voltage output monitoring portion of the monitoring module allows the BMS be capable of monitoring the high voltage relay states of the battery in real time, determining the high voltage output states and judging the causes of the high voltage output dysfunctions according to the relay state signals. By monitoring the battery terminal voltage and the output load terminal voltage during the pre-charge process, the pre-charge monitoring portion judges whether the pre-charge is successful.

The monitored spots, of which the high voltage-output states are monitored are the source electrodes of the high-power MOS tubes of the anode relay, the cathode relay and the pre-charge relay. The monitoring signals are transmitted into the central processor module after they are isolated and filtered. High voltage level of the monitoring signal represents the closed state ("ON" state) of a relay, and low voltage level of the monitoring signals represents the opened state ("OFF" state) of a relay. Corresponding to their real-time states, the monitoring signals of the three relays are sent to BMS in real time.

The pre-charge monitoring portion monitors the battery terminal voltage and the output load terminal voltage, and the central processor module compares the values of the monitoring signals within the time of the pre-charge process.

The control module circuit adopts high power MOS tubes, and the monitoring module determines the relay operation states based on the acquired the MOS tube state signals.

The present invention also discloses a high voltage system of a power battery comprising a battery body, a battery management system, an anode relay, a cathode relay, a pre-charge relay, a pre-charge resist and the aforementioned high voltage output monitoring device.

By using the monitoring device of the present invention, the life of a high voltage relay can be prognosticated, the relay health alarming signals can be issued in real time, and the hazard caused by the relay's failure to be closed when being damaged can be avoided; furthermore, monitoring and controlling the pre-charge states of a power battery is favorable for extending the life of a battery.

The following are description of the reference signs in the attached drawings:

CAN HIGH and CAN LOW refer to CAN communication signals;

BAT+ and BAT− respectively refer to the monitored spots of the anode and cathode of a battery;

RELAY1, RELAY2 and RELAY3 respectively refer to the driving ends lie in the low-voltage side of anode relay, the cathode relay and the pre-charge relay'

LINK+ and LINK− refer to the voltage monitored spots of the voltage output load terminal, MOS1, MOS2 and MOS3 refer to the source electrode monitored spots of the MOS tubes of the anode relay, the cathode relay and the pre-charge relay;

S1, S2 and S3 respectively refer to the relay feedback signals detected at the monitored spots of the MOS tubes by the monitoring module;

CTRL1 refers to the isolation sampling control signal;

BAT and LINK refer to the voltage acquisition signals;

12V power supply refers to a vehicle-use lead-acid accumulator battery; GND refers to a vehicle chassis ground.

DETAILED DESCRIPTION OF THE PREFERRED EMBODIMENTS

The application of the present invention in a hybrid power vehicle and the effects generated therewith are described herein in combination with the attached drawings.

Figure 1:
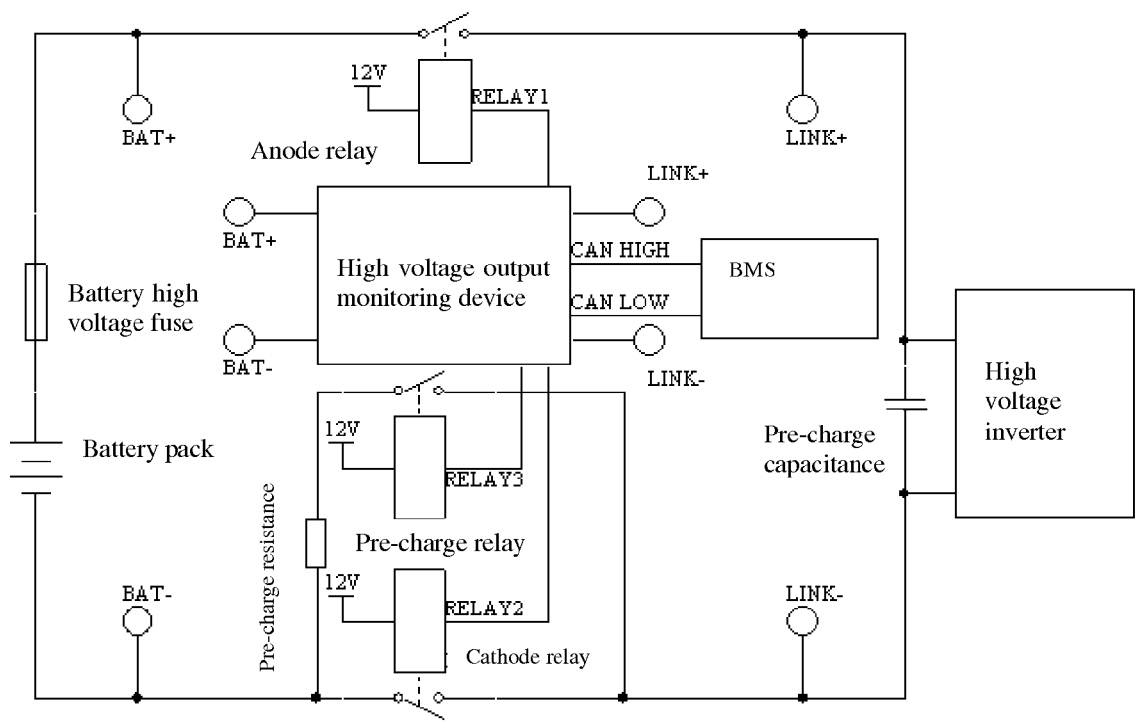
FIG. 1 is the electric schematic diagram of the high voltage system of a battery.

As shown in FIG. 1, the high voltage system of a power battery comprises a battery body, a battery management system BMS, a high voltage output monitoring device, an anode relay, a cathode relay, a pre-charge relay and a pre-charge resistor etc. By controlling a high voltage relay, the battery management system controls the high voltage output of the battery to the pre-charge capacitance and the inverter. The purpose of the configuration of the pre-charge process is to improve the stability of the high voltage system.

The high voltage output monitoring device is designed to realize the following functions:

Function 1: Based on the relay state signals acquired by this device, enables the battery management system to monitor the high voltage relay state of the battery in real time, to determine the high voltage output state and to judge the causes of the high voltage output dysfunction according to the relay state signals sent by this device.

Function 2: By monitoring the battery terminal voltage and the output load terminal voltage during the pre-charge process, judges whether the pre-charge is successful.

Function 3: This device has relay control function. Depending on whether or not the pre-charge is successful, controls whether or not the high voltage is connected. In addition, this device also has the function of switching-on or switching-off the high voltage arbitrarily based on the signals received from the BMS.

Function 4: This device issues three levels of relay health state alarming signals, and the alarming signals are sent to the BMS. According to the alarming signals issued by this device, the owner of a hybrid power vehicle may choose to replace the relay out of preference or find it is imperative to replace the relay.

All these four major functions are realized based on the signals acquired at the high voltage terminal of the battery.

The high voltage output monitoring device is divided into three modules, namely, a monitoring module, a control module and a central processor module. The upper level controller for this device is a battery management systems BMS, and this device is communicated with the BMS via CAN bus.

Each of the modules is described in detail as follows:

I. Monitoring Module

Figure 3:
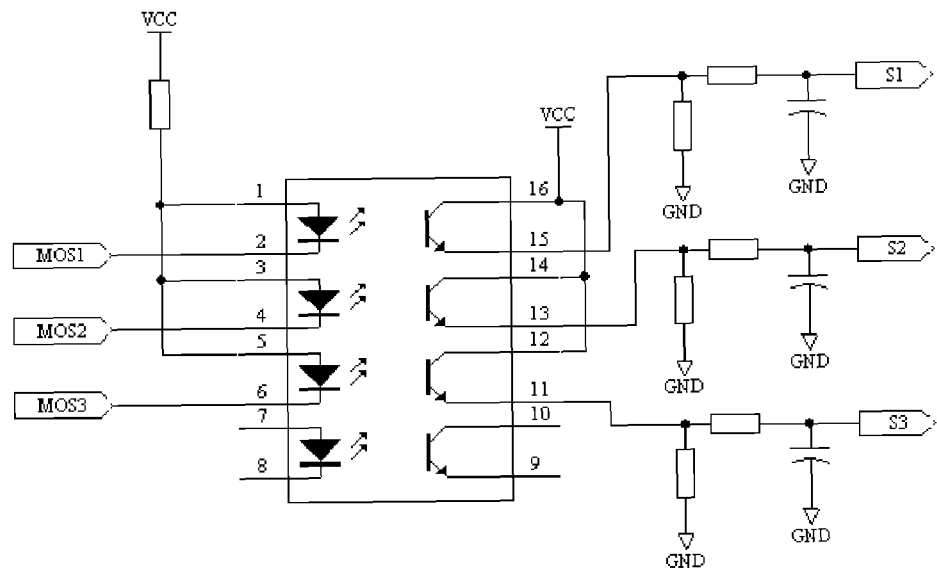
FIG. 3 is the schematic diagram of the monitoring module—high voltage output monitoring portion.
Figure 4:
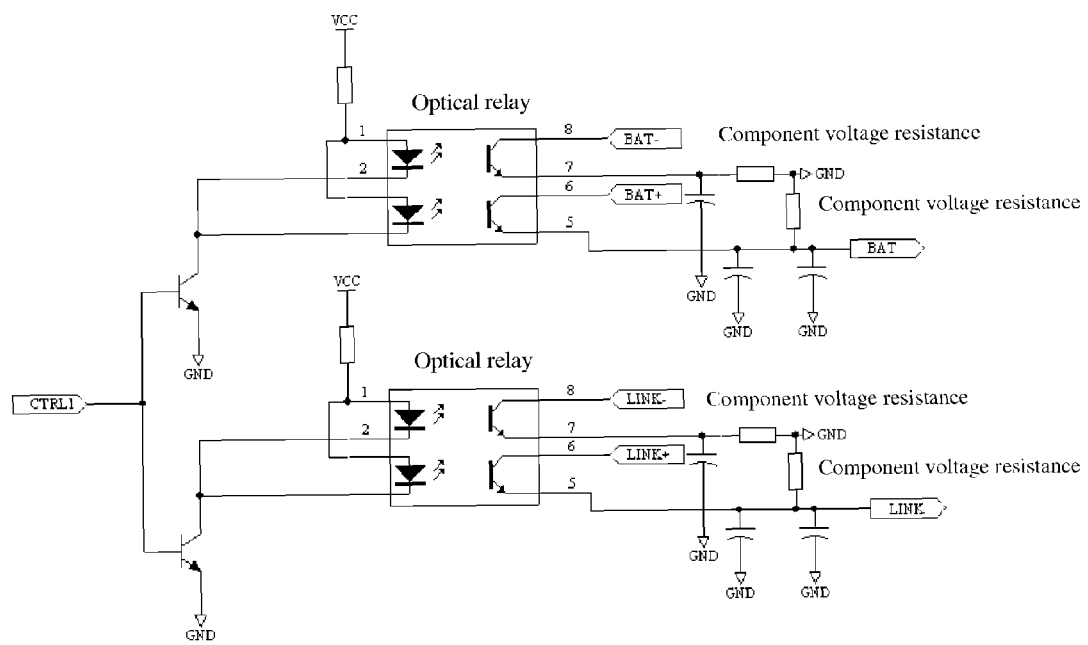
FIG. 4 is the schematic diagram of the monitoring module—pre-charge monitoring portion.

As shown in FIG. 3 and FIG. 4, the monitoring module is designed to realize the following functions: 1) high voltage output monitoring; 2) pre-charge monitoring; 3) monitoring relays' switching times.

As shown in FIG. 3, in this device, the specific monitored spots, of which the high voltage output states are monitored are the source electrodes of each of the three relays' PWM control switches, namely power MOS tubes. The three monitored spots are marked as MOS1, MOS2 and MOS3 corresponding to the sequence of the three anode relays, cathode relays and pre-charge relays respectively, and three feedback monitoring signals S1, S2 and S3 corresponding to the same sequence of the three relays are transmitted into the central processor module of this device. High voltage level of these three monitoring signals represents the on state of the relays, and low voltage level of the monitoring signals represents the off state of relay, corresponding to the relay's state in real time. The three relays' state monitoring signals are transmitted to the central processor module via the isolation filter circuit, and are sent to the BMS in real time. BMS is capable of monitoring the relays' switching times on the basis of these monitoring signals of the three relays.

The pre-charge monitoring portion monitors the pre-charge state, and judges whether the pre-charge is successful. As shown in FIG. 4, the voltage monitored spots, of which the battery terminal voltage and the output load terminal voltage are monitored are the anode and the cathode of the battery, namely BAT+ and BAT−. The isolation sampling control signal sent by the central processor module is indicated as CTRL1, the component voltage value of the monitored total voltage is BAT. The voltage monitoring spots, of which the output load terminal voltage are monitored are indicated as LINK+ and LINK− respectively, the central processor module sends the isolation sampling control signal indicated as CTRL1, and the component voltage value of the monitored total voltage is LINK. Within the time of the pre-charge process, the central processor module compares the monitored values. The pre-charge time refers to a limited time for pre-charge obtained by calculating the battery voltage, the pre-charge resistance and the pre-charge capacitance. Wherein if LINK is more than 80% of BAT, within the preset pre-charge time T from the beginning of pre-charge, indicating that the pre-charge is successful, the monitoring device closes the anode relay and cathode relay, to couple the power battery with the high voltage system; Wherein if the monitored result shows LINK is less than 80% of BAT, within the pre-charge time T, indicating failure of the pre-charge, the monitoring device does not close the anode relay and cathode relay does not couple the power battery fails with the high voltage system.

II. Control Module

Figure 2:
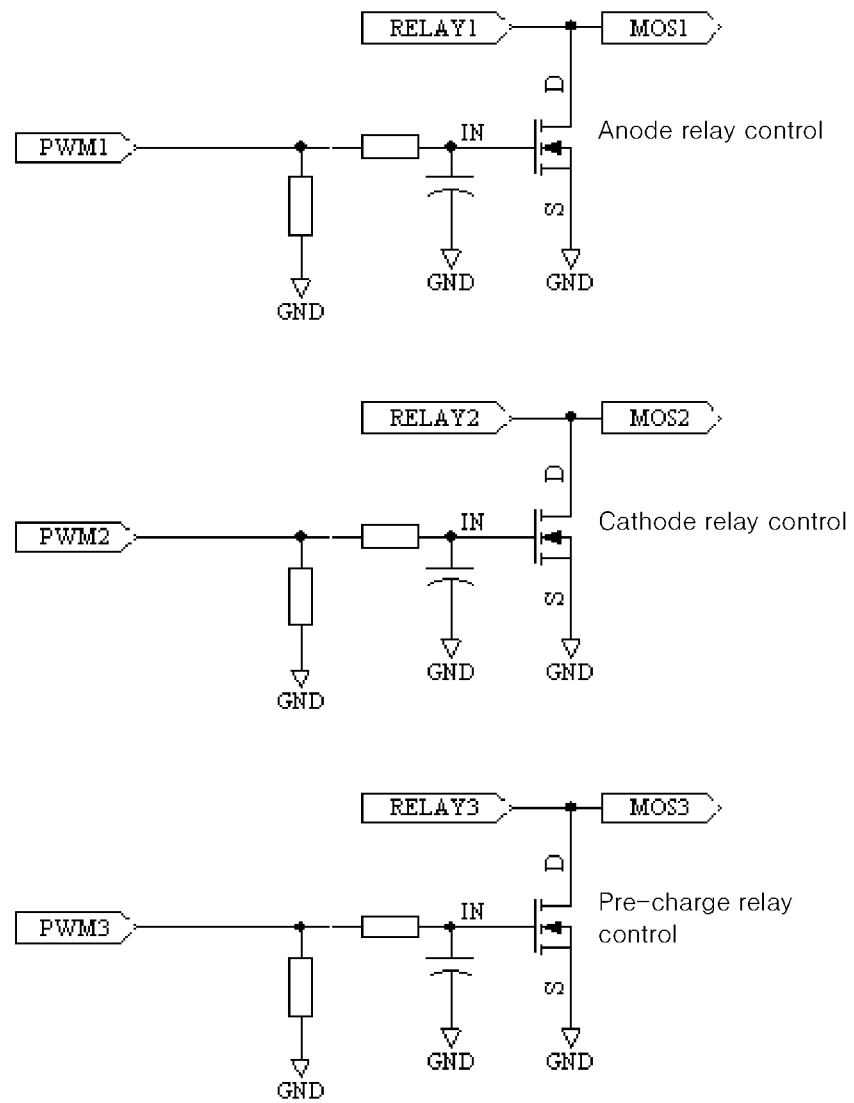
FIG. 2 is the schematic diagram of the control module.

The function of the control module is to control the switching of the relays. As shown in FIG. 2, PWM technology is conventionally adopted for the control of the high voltage relay for its less power consumption. The control module circuit of this device is realized by adopting the PWM control generated by the central processor module. The three PWM control signals for the anode relay, the cathode relay and the pre-charge relay are respectively represented as PWM1, PWM2 and PWM3. The three low voltage driving ends are represented as RELAY1, RELAY2 and RELAY3 respectively and are used for driving the low-voltage sides of the relays. The monitoring module of this device determines the operation states of the relays by acquiring the state signals of the MOS tubes.

III. Central Processor Module

Figure 5:
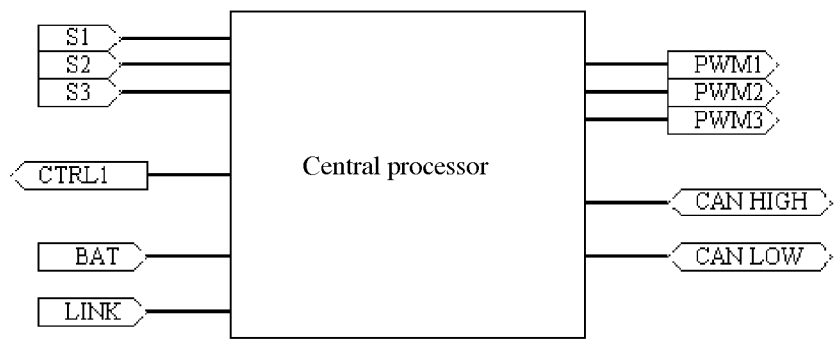
FIG. 5 is the schematic diagram of the central processor module.

As shown in FIG. 5, the central processor module is designed to realize the following functions: 1) analyzing the monitoring signals, packing relay state signals, sending the packaged relay state signals to BMS; 2) prognosticating the relay health condition and send alarming signals of the relay health to BMS; 3) judging the pre-charge states and controlling whether or not high voltage system is connected; 4) receiving the control of BMS, and switching on or off the high voltage system arbitrarily. The central processor module is realized by adopting an 8-bit Singlechip.

By counting the output signals S of the high voltage output monitoring module, the central processor module achieves the object of counting the switching times of the three high voltage relays. The health scale variables of the three relays in the EEPROM of the central processor module are up-dated once upon each counting. Corresponding to the sequence of the three relays of the anode, the cathode and the pre-charge, the health scale variables are represented as A, B and C respectively. The algorithm is as follows: after each new counting the current scale constant=the original scale constant+1/the mechanical life of relay (switching times). Wherein if the scale constant fails to reach 80%, a level-3 alarm is generated; Wherein if the scale constant reaches 80%-100%, a level-2 alarm is generated; Wherein if the scale constant exceeds 100%, level-1 alarm is generated. Three alarming signals of the three relays are issued in real-time.

Figure 6:
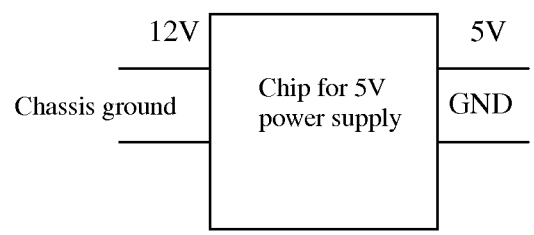
FIG. 6 is the schematic diagram of the power supply.

As shown in FIG. 6, this device is powered by a 5V DC regulated power supply chip.

The application effects of the present invention are described as follows.

When a hybrid power vehicle is started and ignited by a vehicle key, the high voltage battery starts the process of trying to be coupled with the high voltage system of the whole vehicle and the pre-charge process starts. At this moment, the state signals S1 and S3 of the anode relay and pre-charge relay are at high voltage level, while the state signal S2 of the cathode relay is at low voltage level, and the pre-charge performs normally. If, within the pre-charge time, the voltage signal, LINK, acquired by the pre-charge monitoring portion of the monitoring module, reaches higher than 80%*BAT, the anode relay and cathode relay are closed (switched on) under the control of the control module of this device. At this time, the anode relay and cathode relay state signals S1 and S2 should be at high voltage level, and the pre-charge relay state signal S3 should be at low voltage level, which means that the power battery is successfully coupled with the high voltage system. The state signals S1, S2 and S3 of the three relays are sent to BMS in real-time via CAN. If any of the three relay state signals does not comply with aforementioned requirement at pre-charge stage, it is indicated that the pre-charge is a failure. If, within the pre-charge time, the voltage signal, LINK, acquired by the pre-charge monitoring portion of the monitoring module, is lower than 80%*BAT, it is indicated that the pre-charge is a failure, and the anode relay and cathode relay are not allowed to be closed under the control of the control module of this device, which means that the power battery fails to be coupled with the high voltage system. At this moment, the cause of the pre-charge failure may be determined through monitoring the state signals S1, S2 and S3 of the three relays of the anode, the cathode and the pre-charge. Whenever the BMS sends an instruction to close the relay via CAN, this device closes the relay accordingly without other condition. If the pre-charge fails, and RELAY1 and RELAY3 are monitored by the monitoring module, RELAY1 and RELAY3 is closed and opened once respectively, and RELAY2 has no action. and the central processor module will add a constant—1/the mechanical life of relay (switching times)—to the scale constants of the anode relay and the pre-charge relay respectively. At this moment, if the scale constant of the three relays fails to reach 80%, level-3 alarm is issued; If the scale constant reaches 80%-100%, level-2 alarm is issued; If the scale constant exceeds 100%, level-1 alarm is issued. The three alarming signals of the three relays are sent to the BMS in real-time.

Finally it must be mentioned as follows: The above description and embodiments are merely used to describe rather than limit the present invention. Although the detailed description of the present invention is provided with reference to preferred embodiments, those skilled in the art should understand that all the modifications or equitable substitutions to the present invention without deviation from the spirit and conception of present invention shall be covered by the claims of present invention.

The invention claimed is:

1. A high voltage output monitoring device for a power battery comprising a monitoring module, a control module and a central processor module, wherein the monitoring module monitors the high-voltage outputs, the pre-charge and the switching times of the relays; the control module controls the switching of the relay; the central processor module analyzes and processes the monitoring signals, packs the relay state signals, and sends the packaged relay state signals to a battery management system, prognosticates the relay health condition and sends alarming signals to the battery management system, judges the pre-charge states, controls the switching ON or OFF of the high-voltage system, receives the control of the battery management system, and switches on or off the high-voltage system arbitrarily; based on the acquired relay state signals, the high-voltage output monitoring portion of the monitoring module allows the battery management system be capable of monitoring the high voltage relay states in real-time, determining the high-voltage output states and judging the cause of the high-voltage output dysfunction according to the relay state signals; by monitoring the battery terminal voltage and the output load terminal voltage during the pre-charge process, the pre-charge monitoring portion judges whether or not the pre-charge is successful.

2. The high voltage output monitoring device for a power battery of claim 1, wherein, the monitored spots, of which the high voltage outputs are monitored are the source electrodes of the high-power MOS tubes of the of the anode relay, the cathode relay and the pre-charge relay; the monitoring signals are transmitted into the central processor module after they are isolated and filtered; wherein, high voltage level of the monitoring signals represents the closed state of a relay, and low voltage level of monitoring signals represents the opened state of a relay; in this way, the monitoring signals of the three relays corresponding to their real-time states are sent to the battery management system in real-time.

3. The high voltage output monitoring device for a power battery of claim 1, wherein the pre-charge monitoring portion monitors the battery terminal voltage and the output load terminal voltage, and the central processor module compares the values of the monitoring signals within the time of pre-charge process.

4. The high voltage output monitoring device for a power battery of claim 3, wherein the pre-charge time refers to a limited time for pre-charge obtained by calculating the battery voltage, the pre-charge resistance and the pre-charge capacitance;

wherein if the component voltage value of the total voltage LINK is more than 80% of the component voltage of total voltage BAT, within the preset pre-charge time T from the beginning of pre-charge, indicating that the pre-charge is successful, the monitoring device closes the anode relay and cathode relay, to couple the power battery with the high voltage system;

wherein if the monitored result shows LINK is less than 80% of the component voltage of total voltage BAT, within the pre-charge time T, indicating failure of the pre-charge, the monitoring device does not close the anode relay and cathode relay does not couple the power battery with the high voltage system;

wherein LINK refers to the component voltage value of total voltage at load terminal and BAT refers to the component voltage value of the total voltage at battery terminal.

5. The high voltage output monitoring device for a power battery of claim 1, wherein the control module circuit adopts high-power MOS tubes, and the monitoring module determines the relay operation states by acquiring the MOS tube state signals.

6. The high voltage output monitoring device for a power battery of claim 2, wherein the central processor module counts the switching times of the three high voltage relays; the health scale variables of the three relays in the EEPROM of central processor module are updated once upon each counting; after each time of new counting, the current scale constant=the original scale constant+1/the mechanical life of relay;
- wherein if the scale constant fails to reach 80%, level-3 alarm is issued;
- wherein if the scale constant reaches 80%-100%, level-2 alarm is issued;
- wherein if the scale constant exceeds 100%, level-1 alarm is issued; three alarming signals of the three relays are sent in real-time.

7. A high-voltage system of power battery comprising a battery body, a battery management system, an anode relay, a cathode relay, a pre-charge relay, a pre-charge resistor and the high voltage output monitoring device for the power battery as recited in claim 1.

* * * * *